(12) United States Patent
Mele

(10) Patent No.: US 6,814,463 B2
(45) Date of Patent: Nov. 9, 2004

(54) LED FLASHLIGHT AND PRINTED CIRCUIT BOARD THEREFOR

(75) Inventor: Scott A. Mele, Langhorn, PA (US)

(73) Assignee: Tektite Industries, Inc., Trenton, NJ (US)

( * ) Notice: Subject to any disclaimer, the term of this patent is extended or adjusted under 35 U.S.C. 154(b) by 48 days.

(21) Appl. No.: 10/075,776

(22) Filed: Feb. 14, 2002

(65) Prior Publication Data

US 2003/0151915 A1 Aug. 14, 2003

(51) Int. Cl.[7] .............................. F21L 4/02; F21V 33/00
(52) U.S. Cl. ..................... 362/184; 362/800; 362/227; 361/748; 361/760
(58) Field of Search ............................ 362/184, 800, 362/227; 361/748, 760, 749, 750, 751, 736, 737, 784, 790, 795, 793, 792; 313/500; 174/251, 252, 253, 254, 255, 256, 257, 258, 259, 260

(56) References Cited

U.S. PATENT DOCUMENTS

| | | | | |
|---|---|---|---|---|
| 2,597,073 A | * | 5/1952 | Cunningham | 362/184 |
| 4,290,095 A | | 9/1981 | Schmidt | 362/191 |
| 4,346,329 A | | 8/1982 | Schmidt | 315/51 |
| 4,774,643 A | | 9/1988 | McGinnis et al. | 362/189 |
| 4,876,632 A | | 10/1989 | Osterhout et al. | 362/183 |
| 5,400,232 A | | 3/1995 | Wong | 362/276 |
| 5,975,714 A | | 11/1999 | Vetorino et al. | 362/192 |
| 6,095,661 A | | 8/2000 | Lebens et al. | 362/184 |
| 6,160,355 A | | 12/2000 | Yee | 315/200 |
| 6,168,288 B1 | | 1/2001 | St. Claire | 362/184 |
| 6,190,020 B1 | | 2/2001 | Hartley | 362/184 |
| 6,227,679 B1 | * | 5/2001 | Zhang et al. | 362/236 |
| 6,257,734 B1 | | 7/2001 | Tchira | 362/202 |
| 6,268,702 B1 | | 7/2001 | Fleck | 315/185 |
| 6,270,355 B1 | | 8/2001 | Kihara | 439/56 |
| 6,271,478 B1 | | 8/2001 | Horiuchi et al. | 174/255 |
| 6,305,818 B1 | * | 10/2001 | Lebens et al. | 362/184 |

* cited by examiner

Primary Examiner—Sandra O'Shea
Assistant Examiner—Shawn Payne
(74) Attorney, Agent, or Firm—Synnestvedt & Lechner LLP

(57) ABSTRACT

A printed circuit board (PCB) for mounting LEDs in an LED flashlight and a flashlight incorporating the PCB. The PCB includes a circuit board having first and second conductors. The first conductor includes a first section and at least a second section at least partially surrounding the first section. The second conductor includes a first section positioned between the first and second sections of the first conductor and, according to one embodiment, a second section at least partially surrounding the second section of the first conductor. The flashlight includes a housing for receiving a power source, the PCB, LEDs mounted on the PCB, and a switch for turning the flashlight on and off.

28 Claims, 7 Drawing Sheets

LED FLASHLIGHT AND PRINTED CIRCUIT BOARD THEREFOR

FIELD OF THE INVENTION

The present invention relates to flashlights, and, more particularly, to a printed circuit board ("PCB") for mounting a plurality of LEDs within.

BACKGROUND OF THE INVENTION

Flashlights that use one or more LEDs as a light source typically include a housing for a portable power source (e.g., batteries) and a switch to connect and disconnect the LEDs and the power source to turn the flashlight on and off. In U.S. Pat. No. 6,168,288 to St. Claire entitled FLASHLIGHT WITH LIGHT EMITTING DIODES, which is commonly assigned, and which is incorporated fully herein by reference, an LED flashlight is disclosed.

The brightness of an LED flashlight relates to the number of LEDs. Previously, the number of LEDs mountable within an LED flashlight was limited by the structure on which the LEDs were mounted and the arrangement of the LEDs on that structure. For example, in the U.S. Pat. No. 6,168,288 to St. Claire mentioned above, the LEDs are mounted on a printed circuit board (PCB) having an inner conductor and an outer conductor with the terminals of each LED connected to a different conductor. This arrangement effectively limits the number of LEDs that can be mounted on the PCB.

One of the factors that limits the number of LEDs that can be mounted on a PCB is the distance that the terminals of individual LEDs have to travel to connect the LED to the conductors on the PCB. On a PCB having only an inner conductor and an outer conductor, as the number of LEDs mounted on the PCB increases, the positioning of some of the LEDs will require one or both of their terminals to travel greater distances to reach the conductors. Greater distances traveled by the terminals of the LEDs complicates the manufacturing process and may increase the flashlight's susceptibility to shorts and open circuits, thereby interfering with the operation of the LED flashlight.

Accordingly, a need exists for a mounting structure for mounting LEDs within an LED flashlight that addresses the problems and limitations discussed above. The present invention fulfills this need among others.

SUMMARY OF THE INVENTION

The present invention provides for a PCB for use in an LED flashlight which overcomes the aforementioned problems by positioning conductors on the surface of a circuit board to allow a plurality of LEDs to be positioned on the board with each LED substantially adjacent to the conductors. In addition, a flashlight is provided in which the PCB of the present invention may be used.

The PCB of the present invention includes a circuit board having a first surface and a second surface opposite the first surface. On the first surface is a first conductor having a first section and at least a second section at least partially surrounding the first section. Also on the first surface is a second conductor having a first section between the first and second sections of the first conductor, the second conductor being electrically isolated from the first conductor. In one preferred embodiment, the second conductor further includes a second section at least partially surrounding the second section of the first conductor.

The PCB of the present invention is configured to receive a plurality of LEDs. Each of the LEDs has a pair of terminals that may be electrically connected to a separate one of the first and second conductors of the PCB.

The preferred flashlight of the present invention includes a housing having first and second ends and is configured for receiving a power source. A circuit board having a first surface and a second surface opposite the first surface is preferably positioned adjacent to the second end of the housing. The circuit board has a first conductor having a first section and at least a second section at least partially surrounding the first section and a second conductor having a first section between the first and second sections of the first conductor, the second conductor being electrically isolated from the first conductor. A plurality of LEDs, each having a pair of terminals, are electrically connected to the first and second conductors. A cap is preferably mounted on the second end of the housing and a switch is preferably provided to electrically connect and disconnect at least one of the first and second conductors and the power source when the power source is in the housing.

DETAILED DESCRIPTION OF PREFERRED EMBODIMENTS

Figure 1:
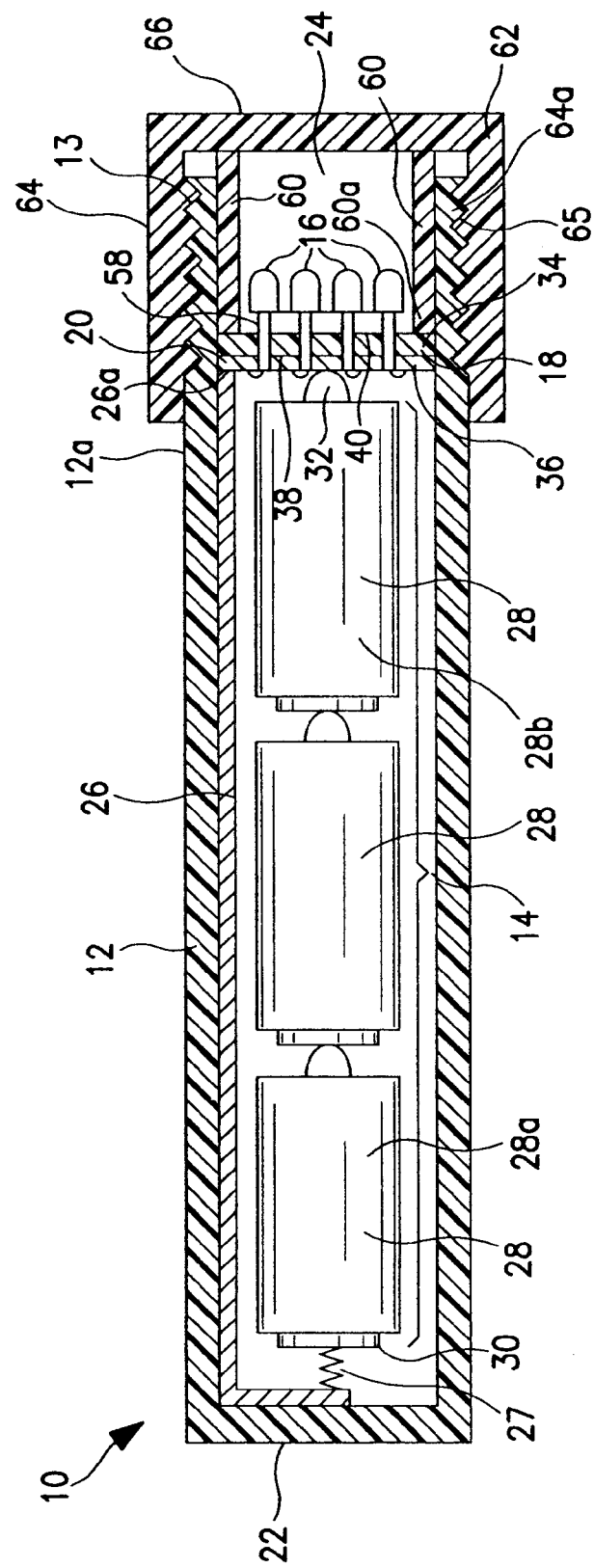
FIG. 1 is a longitudinal sectional view of an LED flashlight in accordance with the present invention.

With reference to FIG. 1, the flashlight 10 includes a housing 12 configured for receiving a power source 14, LEDs 16, a PCB 18 on which the LEDs 16 are mounted, and a switch 20 for connecting and disconnecting the LEDs 16 and the power source 14 to turn the flashlight 10 on and off, respectively. The housing 12 preferably has a closed first end 22 and an open second end 24. A conductor strip 26 preferably extends from the first end 22 to the second end 24, the conductor strip 26 having a conducting biasing element 27, here a metallic spring, at the first end 22 for biasing the power source 14 as described below. Threads 13 are preferably located adjacent the second end 24 of the housing 12 on an external surface 12a. The power source 14 is preferably contained within the housing 12. In the illustrated embodiment, the power source 14 is provided by a plurality of batteries 28 arranged in series as shown. Although three batteries 28 are illustrated, any number of batteries 28 in any configuration can be used depending on the required voltage and current. The battery 28a positioned at the first end 22 of the housing 12 has a first terminal 30 (negative terminal) which engages the conductor strip 26; and the battery 28b positioned at the second end 24 of the housing 12 has a second terminal 32 (positive terminal) for engaging the PCB 18. In an alternative embodiment, the power source 14 may be external to the housing 10. Other suitable power sources 14 for use in the present invention will be readily apparent to those skilled in the art.

Each of the LEDs 16 include a pair of terminals (represented by terminal 58). The LEDs 16 emit light when the power source 14 is coupled across their respective terminals. Any LED which emits light of a desired wavelength can be used. An example of a suitable LED is the Nichia 5 mm white LED sold by the Nichia American Corporation of Lancaster, Pa.

Figure 2A:
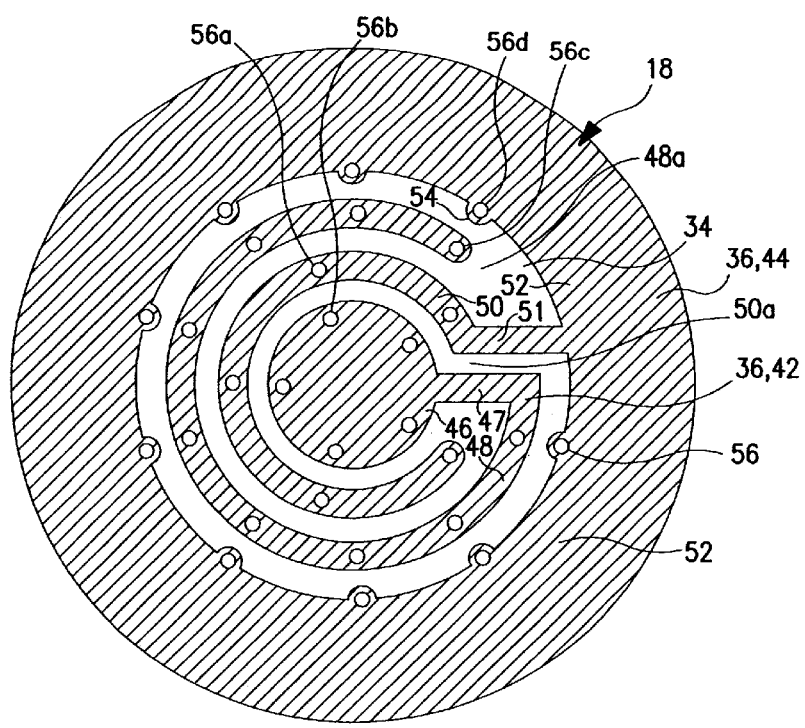
FIG. 2A is an enlarged view of one embodiment of a PCB for mounting 14 LEDs in accordance with the present invention.

With reference to FIG. 1, and further reference to FIG. 2A, the PCB 18 provides a structure on which the plurality of LEDs 16 are mounted. In the illustrated embodiment, the PCB 18 includes a circuit board 34 and conductors 36. The circuit board 34 provides a base on which the conductors 36 are located and to which the LEDs 16 may be mounted. The conductors 36 provide an electrical contact for the LEDs 16, which will be described in detail. The circuit board 34 is of an electrically insulative material, e.g., plastic, and has a first surface 38 and a second surface 40 opposite the first surface 38. The conductors 36 preferably comprise a film of a conductive metal (e.g., copper or aluminum) deposited on the first surface 38. The LEDs 16 may be received on the second surface 40, and electrically connected to the conductors 36 on the first surface 38 through a plurality of holes (represented by hole 56 in FIG. 2A) that extend through the circuit board 34 and conductors 36. In the illustrated embodiment, the circuit board 34 is substantially the same shape as a cross section of the housing 12 (e.g., circular), is positioned in the housing 12 adjacent, but spaced slightly from, the second end 24 of the housing 12, and is positioned such the first surface 38 faces the first end 22 and the second surface 40 faces the second end 24.

Figure 3A:
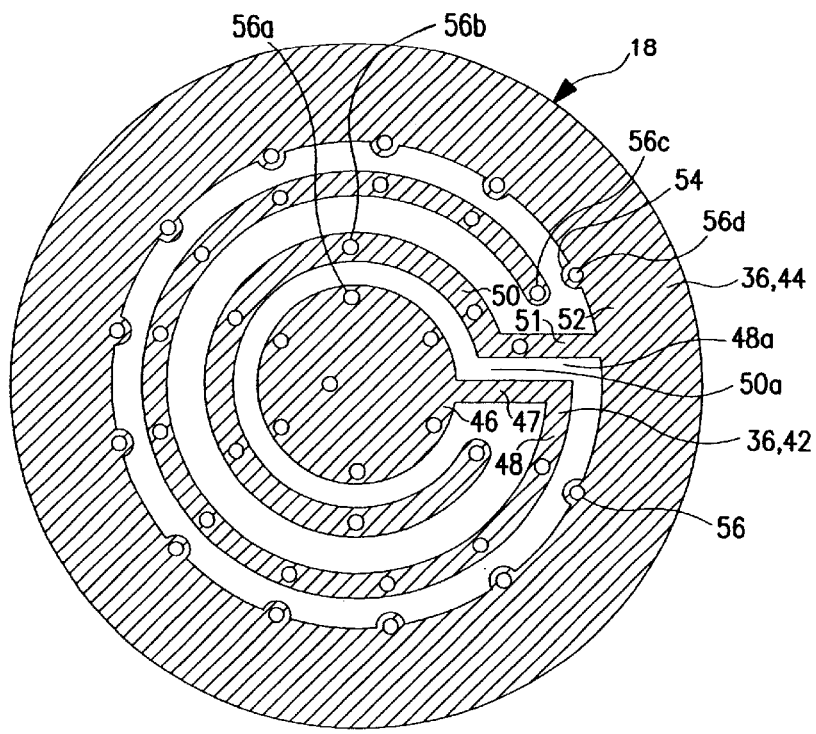
FIG. 3A is an enlarged view of an embodiment of a PCB for mounting 19 LEDs in accordance with the present invention.

FIG. 2A illustrates one embodiment of the PCB 18 that is configured to hold 14 LEDs 16 (FIG. 1). FIG. 3A is identical to FIG. 2A with the exception that it is configured to hold 19 LEDs 16, and thus only FIG. 2A will be described with similar elements being identically labeled. The PCB 18 includes a circuit board 34 and conductors 36 positioned on the circuit board 34. The conductors 36 include a first conductor 42 and a second conductor 44 for electrical connection with the LEDs 16.

The first conductor 42 includes a first section 46 and at least a second section 48 at least partially surrounding, and preferably substantially completely surrounding, the first section 46. In the illustrated embodiment, the first section 46 is a circular area centrally positioned on a substantially circular circuit board 34 and the second section 48 is a semicircular, ring shaped area electrically connected to the first section 46. In an alternative embodiment, the first section 46 is a ring shaped area similar to the second section 48, except with a smaller radius of curvature.

The second conductor 44 includes a first section 50 positioned at least partially between the first and second sections 46, 48 of the first conductor 42. Preferably, the second conductor 44 further includes a second section 52 electrically connected to the first section 50 and at least partially surrounding the second section 48 of the first conductor 42. In the illustrated embodiment, the first and second sections 50, 52 are circular, ring shaped areas, with the second section 52 substantially completely surrounding the first section 50. In addition, in the illustrated embodiment, the second section 52 forms an annulus extending around the peripheral edge of the circuit board 34. As shown in FIG. 2A, the second section 52 of the second conductor 44 has a plurality of tabs (represented by tab 54) extending radially inward from an inner edge of the second section 52.

The second section 48 of the first conductor 42 is a semicircular, ring shaped area, leaving a gap 48a to allow the first and second sections 50, 52 of the second conductor 44 to be connected by conductor section 51; and the first section 50 of the second conductor 44 is a semicircular, ring shaped area, leaving a gap 50a to allow the first and second sections 46, 48 of the first conductor 42 to be connected by conductor section 47. In an alternative embodiment, the second section 48 of the first conductor 42 and the first section 50 of the second conductor 44 may be circular, ring shaped areas without gaps where interconnections between sections are made in a known manner such as through insulated wires or conductors on other circuit boards of a multilayer circuit board. In addition, although the illustrated embodiment depicts four circular sections, the number of circular sections may be increased by alternately adding additional circular sections for each conductor 42, 44.

It will be apparent to those skilled in the art that, in addition to the circular patterns shown, sections of the first and second conductors 42, 44 may have a square shape, an oval shape, or other suitable pattern without departing from the spirit and scope of the present invention. For example, the first conductor may have a first central section with an arm or portion spiraling in an outward direction from the central section. In such an embodiment, the second conductor preferably comprises an annulus with an arm or portion spiraling in an inward direction from the annulus. Alternative conductor layouts in accordance with the present invention will be readily apparent to those skilled in the art based on the teachings contained herein.

In the illustrated embodiments, a plurality of holes (represented by hole 56) extend through the PCB 18. The holes receive the terminals (represented by terminal 58) of the LEDs 16 mounted on a second surface 40 of the circuit board 34 for connection with the conductors 36 on the first surface 38 of the circuit board 34. The holes are preferably positioned such that the LEDs 16 can be substantially evenly distributed on the second surface 40 of the circuit board 34 with the terminals of each of the LEDs 16 near an opening. The holes through the second section 52 of the second conductor 44 extend through the tabs (represented by tab 54).

Connection means are provided to connect the LEDs 16 to the power source 14 when the PCB 18 is positioned within the flashlight 10. With reference to FIG. 1 (and further reference to the conductors 36 as illustrated in FIG. 2A), the first section 46 of the first conductor 42 is configured to contact the terminal 32 of one polarity of the power source 14, e.g., the batteries 28, and the second section 52 of the second conductor 44 is configured to contact a first end 26a of the conductor strip 26, which is connected to the other terminal 30 of an opposite polarity of the power source 14 through the biasing element 27.

Figure 2B:
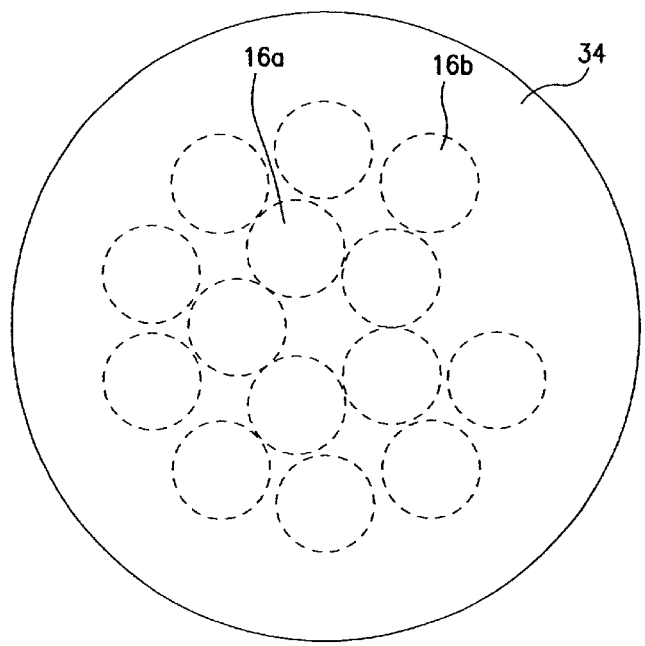
FIG. 2B is a layout view illustrating the position of 14 LEDs on the PCB of FIG. 2A.

FIG. 2B illustrates the positioning of 14 LEDs 16 for connection with the conductors 36 illustrated in FIG. 2A.

Figure 3B:
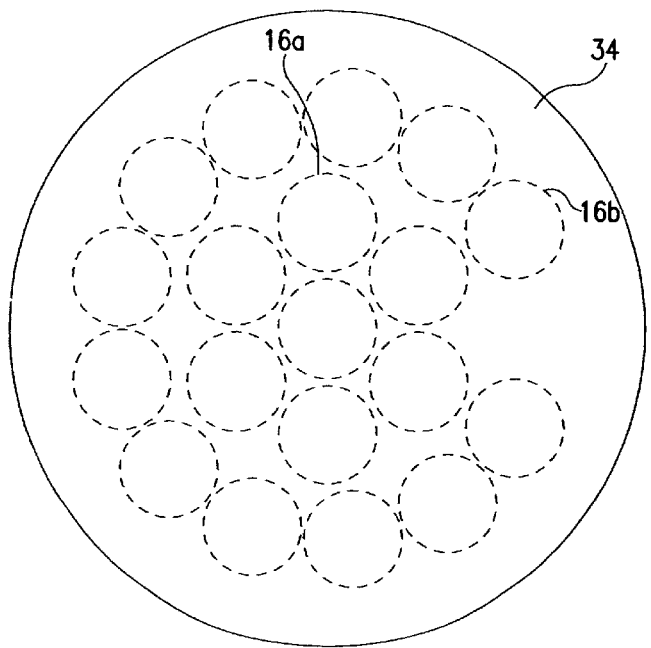
FIG. 3B is a layout view illustrating the position of 19 LEDs on the PCB of FIG. 3A.

FIG. 3B is identical to FIG. 2B with the exception that it illustrates the positioning of 19 LEDs 16 on the PCB 18 illustrated in FIG. 3A. Accordingly, only FIG. 2B will be described below, with similar elements in FIG. 3B being labeled identically. LEDs 16 may be connected to the first and second conductors 42, 44 (FIG. 2A) by their terminals 58 (e.g., with a solder connection). A first LED 16a is connected to the conductors 42, 44 by passing one of its terminals through a first hole 56a (FIG. 2A) for connection with the first section 46 of the first conductor 42 and the other terminal through a second hole 56b (FIG. 2A) for connection with the first section 50 of the second conductor 44. Also, a second LED 16b is connected to the conductors 42, 44 by passing one of its terminals through a third hole 56c (FIG. 2A) for connection with the second section 48 of the first conductor 42 and the other terminal through a fourth hole 56d (FIG. 2A) for connection with the second section 50 of the second conductor 44. With reference to FIG. 1, the LEDs 16 are mounted on the second surface 40 of the circuit board 34 facing the second end 24 of the housing 12. Although there are 14 LEDs mounted on the circuit board 34 in the embodiment depicted in FIG. 2B and 19 LEDs mounted on the circuit board in the embodiment depicted in FIG. 3B, any desired number of the LEDs can be used without departing from the spirit and scope of the present invention.

The switch 20 electrically connects and disconnects the conductors 36 of the PCB 18 from the power source 14 to turn the LEDs 16 on and off, respectively. When the switch 20 is open the flashlight 10 is off and current does not flow through the LEDs 16. When the switch 20 is closed, however, the flashlight 10 is on and current flows through the LEDs 16, thereby illuminating the LEDs 16. Suitable switches for use in the present invention will be readily apparent to those skilled in the art.

In the illustrated embodiment, the switch 20 is operated by rotating a cap 62 of the housing 12. The switch 20 has a gap between the second conductor 44 (FIG. 2A) on the PCB 18 and an end 26a of the conductor strip 26. When the gap is closed, current flows from the terminal 32 of the battery 28b through the first and second sections 46, 48 of the first conductor 42 to the LEDs 16, and then from the LEDs 16 through the first and second sections 50, 52 of the second conductor 44 and through the conductor strip 26 to the terminal 30 of the battery 28a, thereby completing a circuit and illuminating the LEDs 16. The rotation of the cap 62 actuates this switch 20 as discussed below.

The cap 62 is threadingly mounted on the open second end 24 of the housing 12. The cap 62 has a cylindrical wall 64 and a translucent end wall 66 through which light from the LEDs 16 can pass. The cylindrical wall 64 of the cap 62 has an inner surface 64a with threads 65 for threadingly engaging the threads 13 of the second end 24 of the housing 12. The translucent end wall 66 of the cap 62 extends across the second end 24 of the housing 12. At least the end wall 66 of the cap 62 is of a translucent material to allow light from the LEDs 16 to pass therethrough, although the entire cap 62 is of translucent material in the embodiment shown.

A cylindrical spacer ring 60 is positioned within the housing 12 at the second end 24 between the end wall 66 of the cap 62 and the PCB 18. The spacer ring 60 extends from the circuit board 34 beyond the open end 24 of the housing 12 and beyond the ends of the LEDs 16. The outer diameter of the spacer ring 60 is sized to be slidable within the housing 12, while not contacting the LEDs 16, instead contacting the PCB 18 along its outermost portions.

In the operation of the flashlight 10, the cap 62 is rotated on its threads 65 relative to the housing 12 to move the cap 62, and thus the PCB 18, toward the first end 22 of the housing 12. As the cap 62 moves toward the left as seen in FIG. 1 (toward the first housing end 22), the spacer ring 60 moves the PCB 18 toward the end 26a of the conductor strip 26. With sufficient rotation of the cap 62, the PCB 18 is moved such that the second section 52 of the second conductor 44 (FIG. 2A) contacts the conductor strip 26 to complete the electrical circuit, and illuminate the LEDs 16. Thus, the cap 62 can be threaded onto the housing 12 so as to act as a switch 20 to turn the flashlight 10 on. When the cap 62 is rotated on the housing 12 in the opposite direction, the spring 27, through the batteries 28, moves the PCB 18 away from the conductor strip 26 to break the electrical circuit between the batteries 28 and the LEDs 16, and thereby turn of the LEDs 16. Thus, the cap 62 serves as part of a switch 20 to turn the flashlight 10 on and off. Other types of switches can also be used. For example, push button switches and sliding thumb switches are well known in the art.

It is seen that the spring 27 urges the batteries 28 to the rights as seen in FIG. 1, which in turn urges the PCB up against the lower end 60a of the spacer 60, which in turn is kept flush against the translucent end wall 66 of the cap 62. This movement of the cap 62 moves the spacer 60, PCB 18, and batteries 28 as a unit with the cap 62.

Figure 4:
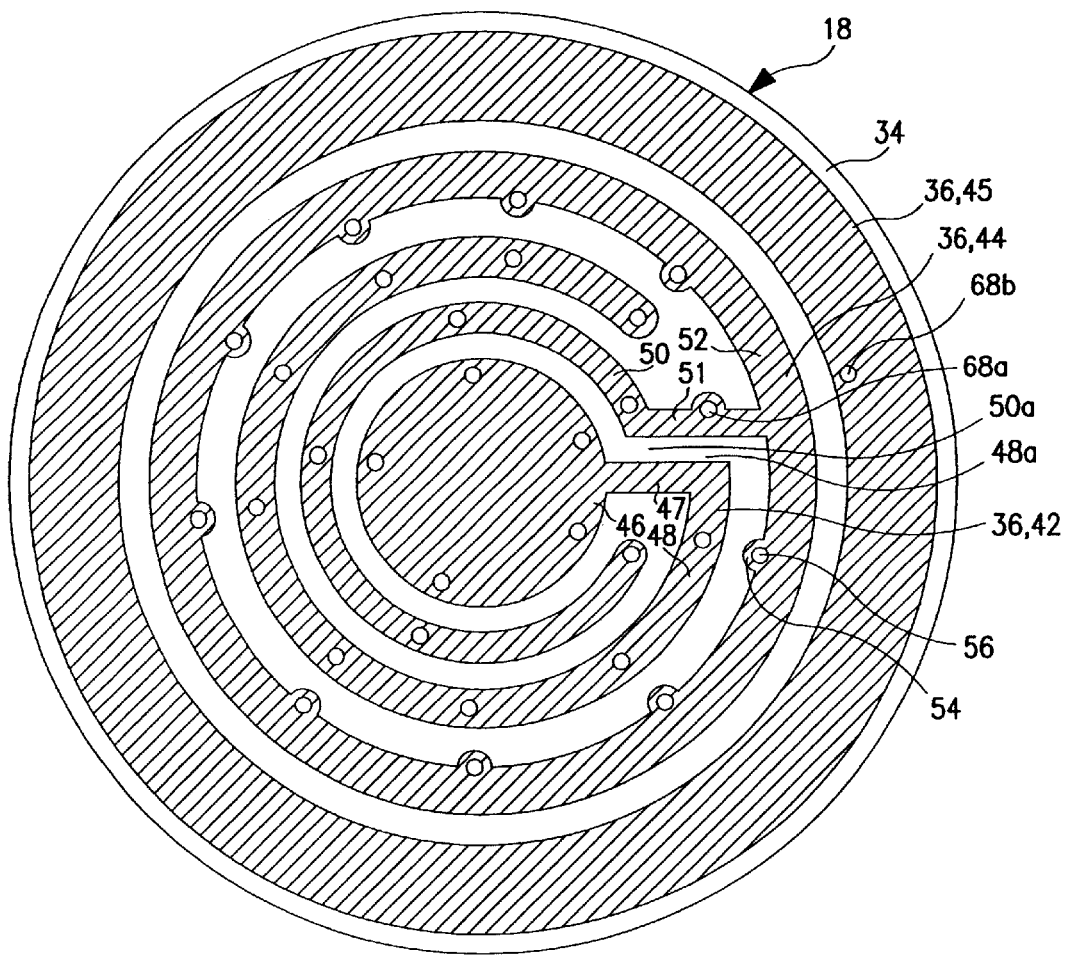
FIG. 4 is an enlarged view of an alternative embodiment of a PCB for mounting 14 LEDs in accordance with the present invention.
Figure 5:
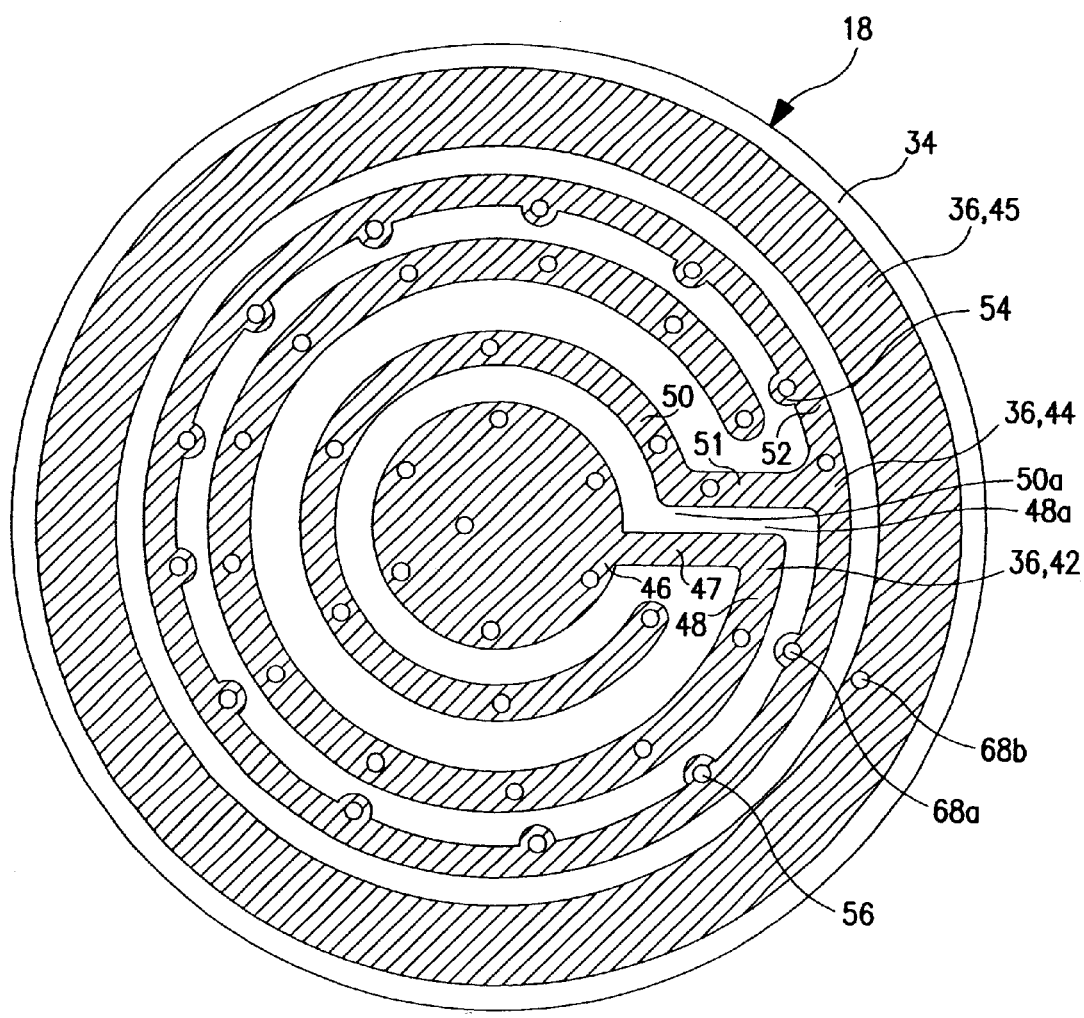
FIG. 5 is an enlarged view of an alternative embodiment of a PCB for mounting 19 LEDs in accordance with the present invention.

FIG. 4 illustrates another embodiment of the PCB 18 that is configured to hold 14 LEDs 16. FIG. 5 is identical to FIG. 4 with the exception that it is configured to hold 19 LEDs 16 and thus only FIG. 4 will be described below. Similar elements in FIGS. 4 and 5 are identically labeled. The PCB 18 includes a circuit board 34 and conductors 36 positioned on the circuit board 34. The conductors 36 include a first conductor 42 and a second conductor 44 for electrical connection with the LEDs 16. In addition, the conductors 36 include a third conductor 45, which may be connected to the second conductor 44 via a resistor.

The first conductor 42 includes a first section 46 and a second section 48 at least partially surrounding, and preferably substantially completely surrounding, the first section 46. The second conductor 44 includes a first section 50 positioned at least partially between the first and second sections 46, 48 of the first conductor 42. In the illustrated embodiment, the second conductor 44 further includes a second section 52 at least partially surrounding the second section 48 of the first conductor 42. Additionally, the third conductor 45 forms an annulus extending essentially around the peripheral edge of the circuit board 34 for connection with the conductor strip 26 (FIG. 1). The third conductor may be electrically connected to the second conductor 44 through a resistor. The resistor creates a voltage drop between the second conductor 44 and the third conductor 45 that may be used to step down the voltage level of the power source 14 to a level suitable for the LEDs 16. The resistor may be coupled on a first end to the second conductor 44 through a first hole 68a and on a second end to the third conductor 45 through a second hole 68b.

Figure 6:
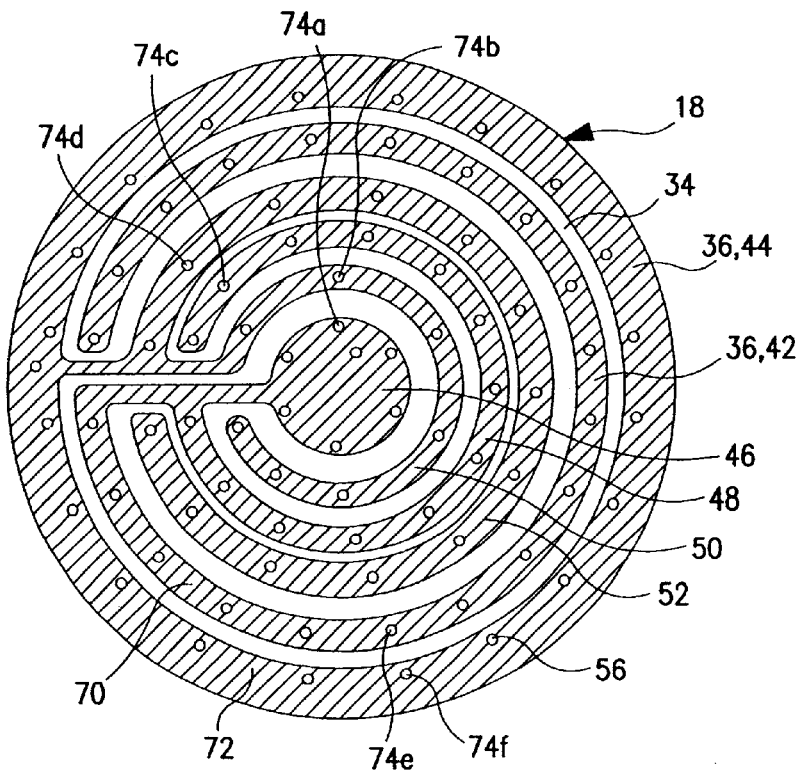
FIG. 6 is an enlarged view of an embodiment of a PCB for mounting 40 LEDs in accordance with the present invention.

FIG. 6 illustrates another embodiment of the PCB 18 that is configured to hold 40 LEDs 16. The PCB 18 includes a circuit board 34 and conductors 36 positioned on the circuit board 34. The conductors 36 include a first conductor 42 and a second conductor 44 for electrical connection with the LEDs 16. The first conductor 42 includes a first section 46, a second section 48 at least partially surrounding the first section 46, and a third section 70 at least partially surrounding the second section 48. The second conductor 44 includes a first section 50 positioned at least partially between the first and second sections 46, 48 of the first conductor 42; a second section 52 positioned at least partially between the second and third sections 48, 70 of the first conductor 42; and a third section 72 at least partially surrounding the third section 70 of the first conductor 42.

The 40 LEDs 16 may be positioned in three concentric circles on the PCB 18 with one terminal of each LED 16 connected to the first conductor 42 and the other connected to the second conductor 44. A first of the concentric circles is formed by a first set of LEDs 16, a second is formed by a second set of LEDs 16, and a third is formed by a third set of LEDs 16. Each of the first set of LEDs 16 has one terminal connected to a hole through the first section 46 of the first conductor 42, e.g., through hole 74a, and the other terminal connected to a hole through the first section 50 of the second conductor 44, e.g., through hole 74b. Each of the second set of LEDs 16 has one terminal connected to a hole through the second section 48 of the first conductor 42, e.g., through hole 74c, and the other terminal connected to a hole through the second section 52 of the second conductor 44, e.g., through hole 74d. Each of the third set of LEDs 16 has one terminal connected to a hole through the third section 70 of the first conductor 42, e.g., through hole 74e, and the other terminal connected to a hole through the third section 72f of the second conductor 44, e.g., through hole 74f.

Figure 7:
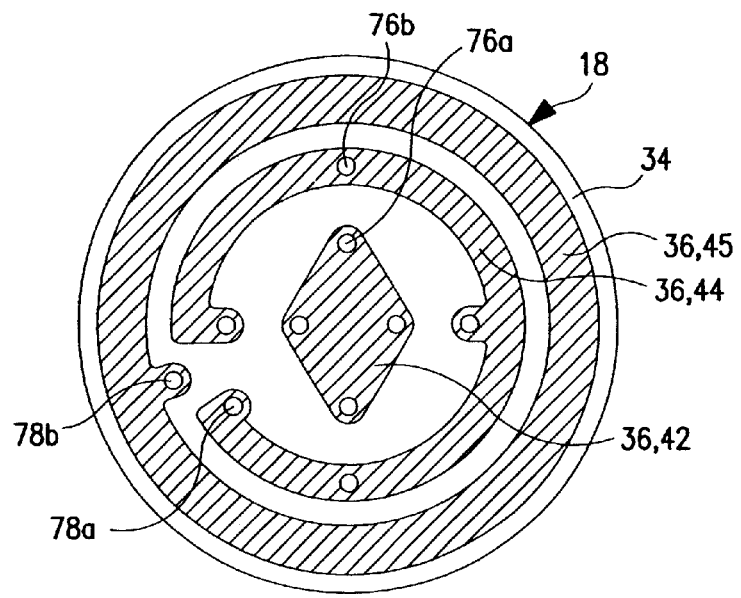
FIG. 7 is an enlarged view of an embodiment of a PCB for mounting 4 LEDs in accordance with the present invention.

FIG. 7 illustrates another embodiment of the PCB 18 that is configured to hold 4 LEDs 16. The PCB 18 includes a circuit board 34 and conductors 36 positioned on the circuit board 34. The conductors 36 include a first conductor 42 and a second conductor 44 for electrical connection with the LEDs 16. One terminal of an LED 16 passes through a first hole 76a for connection with the first conductor 42 and the other terminal of the LED 16 passes through a second hole 76b for connection with the second conductor 44. Additional LEDs 16 are connected to the conductors 42, 44 is a similar manner. In addition, the conductors 36 include a third conductor 45, which may be connected to the second conductor 44 via a resistor. The resistor may be coupled on a first end to the second conductor 44 through a first hole 78a and on a second end to the third conductor 45 through a second hole 78b.

Figure 8:
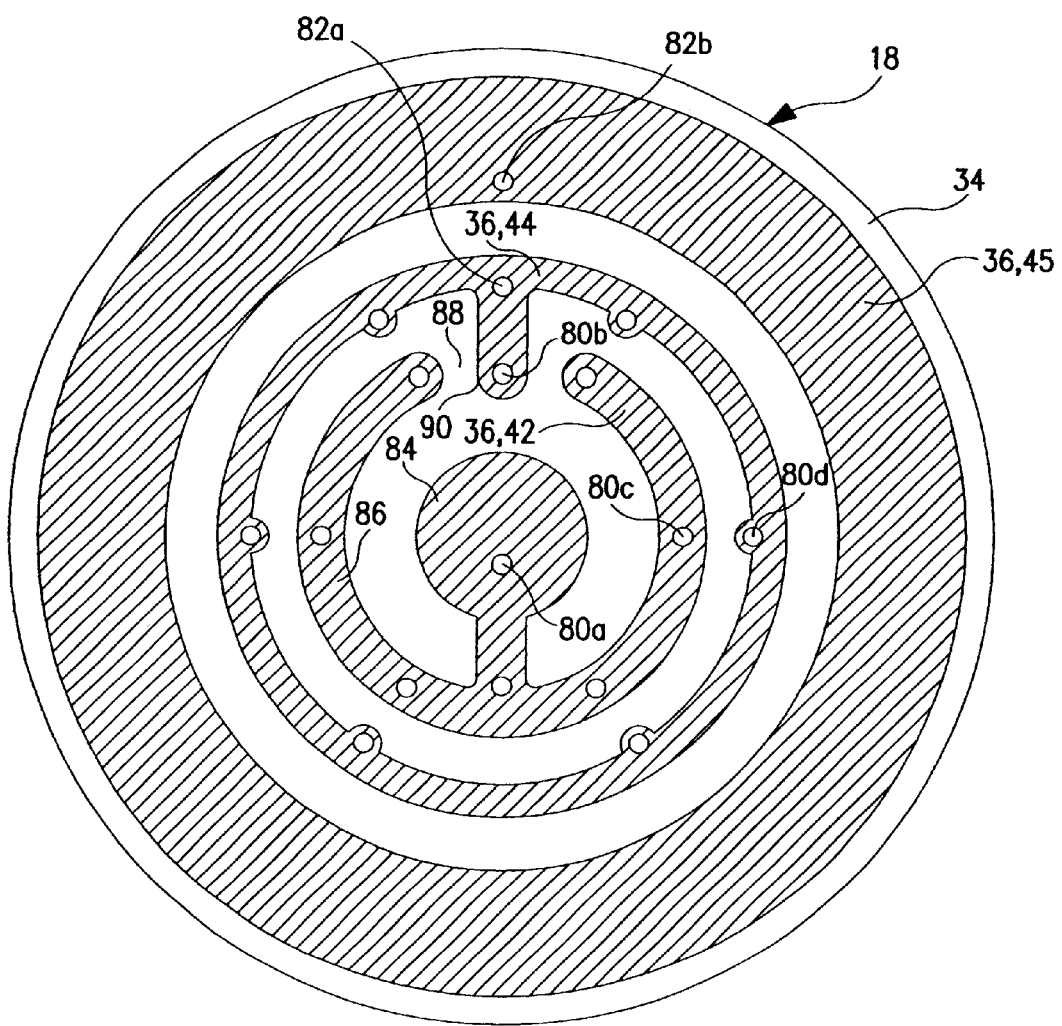
FIG. 8 is an enlarged view of an embodiment of a PCB for mounting 7 LEDs in accordance with the present invention.

FIG. 8 illustrates another embodiment of the PCB 18 that is configured to hold 7 LEDs 16. The PCB 18 includes a circuit board 34 and conductors 36 positioned on the circuit board 34. The conductors 36 include a first conductor 42 and a second conductor 44 for electrical connection with the LEDs 16. The first conductor 42 has a central section 84 and a semicircular, ring shaped section 86 at least partially surrounding and spaced from the central section 84. The central section 84 is electrically connected to the semicircular, ring shaped section 86. The semicircular, ring shaped section 86 includes a gap 88. The second conductor 44 at least partially surrounds and is electrically isolated from the semicircular, ring shaped section 86 and includes a member 90 extending into the gap 88 toward the central section 84. In addition, the conductors 36 include a third conductor 45, which may be connected to the second conductor 44 via a resistor. The resistor may be coupled on a first end to the second conductor 44 through a first hole 82a and on a second end to the third conductor 45 through a second hole 82b.

In one embodiment, the 7 LEDs 16 may be positioned such that a central LED 16 is encircled by the remaining LEDs 16, with one terminal of each LED 16 connected to the first conductor 42 and the other connected to the second conductor 44. The central LED 16 has one terminal connected to a hole 80a through the central section 84 and the other terminal connected to a hole 80b through the member 90. Each of the LEDs 16 encircling the central LED 16 has one terminal connected to a hole through the semicircular, ring shaped section 86 of the first conductor 42, e.g., through hole 80c, and the other terminal connected to a hole through the second conductor 44, e.g., through hole 80d.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A PCB for use in a flashlight having a plurality of LEDs as a light source, said PCB comprising:
    a circuit board comprising an insulating material and having a first surface and a second surface opposite said first surface;
    a first conductor on said first surface of said circuit board having a first section and at least a second section surrounding a substantial portion of said first section; and
    a second conductor on said first surface of said circuit board having a first section between said first and second sections of said first conductor, said second conductor being electrically isolated from said first conductor.

2. A PCB in accordance with claim 1, wherein said second section of said first conductor substantially completely surrounds said first section of said first conductor.

3. A PCB in accordance with claim 1, wherein said first and second sections of said first conductor and said first section of said second conductor are circular.

4. A PCB in accordance with claim 3, wherein said second conductor further comprises a second section at least partially surrounding said second section of said first conductor.

5. A PCB in accordance with claim 4, further comprising a plurality of holes extending through said circuit board and said first and second conductors for receiving terminals of the LEDs.

6. A PCB in accordance with claim 4, wherein said board is substantially circular.

7. A PCB in accordance with claim 6, wherein said first section of said first conductor is centrally positioned on said circular board and said second section of said second conductor extends in an annular path around the peripheral edge of said circular board.

8. A PCB in accordance with claim 7, further comprising a first set of holes through said first section of said first conductor and said circular board and through said first section of said second conductor and said circular board and a second set of holes through said second section of said first conductor and said circular board and through said second section of said second conductor and said circular board, said first set of holes positioned to receive the terminals of each LED of a first set of the plurality of LEDs for connection with a separate conductor and said second set of holes positioned to receive the terminals of each LED of a second set of the plurality of LEDs for connection with a separate conductor.

9. A PCB in accordance with claim 1, further comprising a third conductor on said first surface of said circuit board at least partially surrounding said first and second conductors, said third conductor being electrically isolated from said first and second conductors.

10. A PCB in accordance with claim 1 in combination with LEDs for use in an LED flashlight, comprising:
a plurality of LEDs, each of said plurality of LEDs having a pair of terminals, each terminal of said pair of terminals being electrically connected to a separate one of said first and second conductors.

11. A PCB with LEDs in accordance with claim 10, wherein said first and second sections of said first conductor and said first section of said second conductor are circular.

12. A PCB with LEDs in accordance with claim 11, wherein said second conductor further comprises a second section at least partially surrounding said second section of said first conductor.

13. A PCB with LEDs in accordance with claim 12, further comprising a plurality of holes extending through said circuit board and said first and second conductors for receiving terminals of said LEDs.

14. An LED flashlight comprising:
a housing for receiving a power source;
a circuit board having a first surface and a second surface opposite said first surface;
a first conductor on said circuit board having a first section and at least a second section surrounding a substantial portion of said first section;
a second conductor on said circuit board having a first section between said first and second sections of said first conductor, said second conductor being electrically isolated from said first conductor; and
a plurality of LEDs for providing light, each of said plurality of LEDs having a pair of terminals, each terminal of said pair of terminals being electrically connected to a separate one of said first and second conductors, said LEDs being electrically connectable to said power source to illuminate said LEDs.

15. An LED flashlight in accordance with claim 14, further comprising:
a switch for electrically connecting and disconnecting said power source from said LEDs.

16. An LED flashlight in accordance with claim 14, wherein said first and second sections of said first conductor and said first section of said second conductor are circular.

17. An LED flashlight in accordance with claim 16, wherein said second conductor further comprises a second section at least partially surrounding said second section of said first conductor.

18. An LED flashlight in accordance with claim 14, wherein said first surface of said circuit board faces in the direction of said power source when said power source is received, said first and second conductors being positioned on said first surface of said circuit board, and said plurality of LEDs being positioned on said second surface of said circuit board facing away from said power source.

19. An LED flashlight in accordance with claim 18, wherein said plurality of LEDS are connected to said first and second conductors through a plurality of holes extending through said circuit board and said first and second conductors.

20. A flashlight comprising:
a housing having a first end and a second end, said first end being closed and configured to receive at least one battery, said second end having a cap;
a circuit board having a first surface and a second surface opposite said first surface, said circuit board being positioned adjacent said second end of the housing, said first surface facing in a direction away from said cap;
a first conductor on said first surface of the circuit board having a first section and at least a second section at least partially surrounding said first section;
a second conductor on said first surface of the circuit board having a first section between said first and second sections of said first conductor and a second section at least partially surrounding said second section of said first conductor, said second conductor being electrically isolated from said first conductor;
a plurality of LEDs for producing light, each of said LEDs having a pair of terminals, said LEDs being positioned on said second surface of the circuit board with each of the terminals of each of said plurality of LEDs being electrically connected to a separate one of said first and second conductors, said LEDs being positioned adjacent said cap; and
a switch to electrically connect and disconnect at least one of said first and second conductors from the battery, when said battery is received, to turn the flashlight on and off.

21. The flashlight of claim 20, further comprising a conductor strip of a conductive metal mounted on and extending longitudinally along the housing between the first end of the housing and the circuit board, said conductor strip being engagable at one end by a terminal of the battery and being engagable at the other end by one of said first and second conductors on the circuit board.

22. The flashlight of claim 21, further comprising a cylindrical spacer ring positioned within the housing between the circuit board and the second end of the housing and extending around said plurality of LEDs, said spacer ring being engagable by said cap to be capable of pushing the spacer ring against said circuit board so as to move said circuit board to bring said second section of said second conductor towards the conductor strip.

23. A PCB for use in a flashlight having a plurality of LEDs as a light source, comprising:
a circuit board having an insulating material and a first surface and a second surface opposite said first surface;
a first conductor on said first surface of said circuit board, said first conductor having a central section and a semicircular second section at least partially surrounding and spaced from said central section and electrically connected thereto, said second section further comprising a gap;
a second conductor on said first surface at least partially surrounding said second section of said first conductor and electrically isolated therefrom, said second conductor having a member extending into said gap towards said first section of said first conductor; and
a third conductor on said first surface of said circuit board at least partially surrounding said first and second conductors, said third conductor being electrically isolated from said first and second conductors.

24. A PCB for use in a flashlight having a plurality of LEDs as a light source, said PCB comprising:
a circuit board comprising an insulating material and having a first surface and a second surface opposite said first surface;
a first conductor on said first surface of said circuit board;
a second conductor on said first surface of said circuit board at least partially surrounding said first conductor, said second conductor being electrically isolated from said first conductor; and
a third conductor on said first surface of said circuit board at least partially surrounding said first and second conductors, said third conductor being electrically isolated from said first and second conductors; wherein said second and third conductors are configured to receive a resistor, said resistor coupled on a first end to the second conductor and on a second end to the third conductor.

25. A PCB for use in a flashlight having a plurality of LEDs as a light source, said PCB comprising:
   a circuit board comprising an insulating material and having a first surface and a second surface opposite said first surface;
   a first conductor on said first surface of said circuit board having a first section and at least a second section substantially completely surrounding said first section; and
   a second conductor on said first surface of said circuit board having a first section between said first and second sections of said first conductor, said second conductor being electrically isolated from said first conductor.

26. A PCB for use in a flashlight having a plurality of LEDs as a light source, said PCB comprising:
   a circuit board comprising an insulating material and having a first surface and a second surface opposite said first surface;
   a first conductor on said first surface of said circuit board having a first section and at least a second section at least partially surrounding said first section; and
   a second conductor on said first surface of said circuit board having a first section between said first and second sections of said first conductor, said second conductor being electrically isolated from said first conductor; and
   said first and second sections of said first conductor and said first section of said second conductor are circular.

27. A PCB in accordance with claim 1, wherein said first section of said second conductor extends in a curved direction between said first and second sections of said first conductor.

28. A PCB in accordance with claim 14, wherein said first section of said second conductor extends in a curved direction between said first and second sections of said first conductor.

* * * * *